(12) United States Patent
Dai et al.

(10) Patent No.: US 12,282,236 B2
(45) Date of Patent: Apr. 22, 2025

(54) CIRCUIT BOARD, DISPLAY SUBSTRATE AND DISPLAY APPARATUS

(71) Applicants: Hefei BOE Display Technology Co., Ltd., Anhui (CN); BOE Technology Group Co., Ltd., Beijing (CN)

(72) Inventors: Ke Dai, Beijing (CN); Ruilian Li, Beijing (CN); Chunyang Nie, Beijing (CN)

(73) Assignees: Hefei BOE Display Technology Co., Ltd., Anhui (CN); BOE Technology Group Co., Ltd., Beijng (CN)

( * ) Notice: Subject to any disclaimer, the term of this patent is extended or adjusted under 35 U.S.C. 154(b) by 0 days.

(21) Appl. No.: 18/016,278

(22) PCT Filed: Feb. 28, 2022

(86) PCT No.: PCT/CN2022/078386
§ 371 (c)(1),
(2) Date: Jan. 13, 2023

(87) PCT Pub. No.: WO2023/159592
PCT Pub. Date: Aug. 31, 2023

(65) Prior Publication Data
US 2024/0248352 A1    Jul. 25, 2024

(51) Int. Cl.
*G02F 1/1345*    (2006.01)

(52) U.S. Cl.
CPC .................. *G02F 1/13452* (2013.01)

(58) Field of Classification Search
None
See application file for complete search history.

(56) References Cited

U.S. PATENT DOCUMENTS 5,543,729 A * 8/1996 Henley ............... G01R 31/308
324/760.02
5,684,555 A * 11/1997 Shiba .................... G02F 1/1345
349/154

(Continued)

FOREIGN PATENT DOCUMENTS

| CN | 101187735 A | 5/2008 |
| CN | 112365831 A | 2/2021 |
| CN | 113851485 A | 12/2021 |

OTHER PUBLICATIONS

Original and Translation of KR20070012077 (Year: 2007).*
Original and Translation of TW201403170 (Year: 2014).*
Original and Translation of KR20220015739 (Year: 2022).*

*Primary Examiner* — Binh B Tran
*Assistant Examiner* — Muhammed Azam
(74) *Attorney, Agent, or Firm* — IPro, PLLC (57) ABSTRACT

A circuit board includes an input side and an output side oppositely arranged, and the output side is configured to electrically connect to a display substrate. The circuit board includes a plurality of signal lines extending in a direction from the input side to the output side. Each of the plurality of signal lines includes a main body and a plurality of output branches. Each of the plurality of output branches is connected to one end of the main body close to the output side and has a same line width. A line width of the main body is greater than a sum of line widths of all the output branches belonging to same signal line.

14 Claims, 7 Drawing Sheets

(56) References Cited

U.S. PATENT DOCUMENTS

| | | | |
|---|---|---|---|
| 6,522,378 B1 * | 2/2003 | Mizuno | G02F 1/1345 349/139 |
| 6,590,629 B1 * | 7/2003 | Hirobe | G02F 1/13452 349/149 |
| 6,686,987 B1 * | 2/2004 | Sakaki | G02F 1/13452 349/149 |
| 7,002,657 B2 * | 2/2006 | Hirosue | G02F 1/1345 345/206 |
| 7,463,230 B2 * | 12/2008 | Lee | G02F 1/1345 345/204 |
| 7,576,706 B2 * | 8/2009 | Lim | G09G 3/3611 345/1.3 |
| 7,649,607 B2 * | 1/2010 | Nakagawa | G02F 1/1345 349/149 |
| 7,787,096 B2 * | 8/2010 | Ohgiichi | G02F 1/1345 349/151 |
| 7,812,914 B2 * | 10/2010 | Fujikawa | G02F 1/136259 349/151 |
| 8,154,701 B2 * | 4/2012 | Hong | H05K 3/361 349/149 |
| 8,400,440 B2 * | 3/2013 | Takenaka | G02F 1/13452 345/206 |
| 8,902,394 B2 * | 12/2014 | Takenaka | H05K 3/4092 349/150 |
| 9,029,710 B2 * | 5/2015 | Jung | H05K 7/06 174/254 |
| 9,070,334 B2 * | 6/2015 | Chen | G09G 3/3648 |
| 9,185,817 B2 * | 11/2015 | Ohno | G02F 1/13456 |
| 9,508,485 B1 * | 11/2016 | Vinciarelli | H04L 25/0266 |
| 9,536,459 B2 * | 1/2017 | Wen | G02F 1/13452 |
| 9,547,207 B2 * | 1/2017 | Moh | G02F 1/13452 |
| 9,626,930 B2 * | 4/2017 | Kwak | G02F 1/133345 |
| 9,875,699 B2 * | 1/2018 | Fujikawa | G02F 1/13452 |
| 10,824,198 B2 * | 11/2020 | Luo | H05K 1/189 |
| 11,443,989 B2 * | 9/2022 | Dai | H01L 22/12 |
| 11,614,667 B2 * | 3/2023 | Xiao | G02F 1/136286 345/173 |
| 11,630,534 B2 * | 4/2023 | Qiao | G06F 3/044 345/174 |
| 11,758,658 B2 * | 9/2023 | Tian | G02F 1/13458 361/749 |
| 11,927,844 B2 * | 3/2024 | Sun | G09G 3/3677 |
| 11,968,775 B2 * | 4/2024 | Na | H05K 1/0225 |
| 2004/0036833 A1 * | 2/2004 | Monzen | H05K 3/361 349/158 |
| 2004/0189922 A1 * | 9/2004 | Ono | G02F 1/134363 349/141 |
| 2008/0055518 A1 * | 3/2008 | Jung | G02B 6/0055 349/67 |
| 2008/0100763 A1 * | 5/2008 | Park | G02F 1/13452 174/250 |
| 2008/0117376 A1 | 5/2008 | Takenaka | |
| 2009/0135364 A1 * | 5/2009 | Lee | G02F 1/13452 349/149 |
| 2010/0245299 A1 * | 9/2010 | Han | G02F 1/13452 345/204 |
| 2011/0085122 A1 * | 4/2011 | Fu | G02F 1/13452 345/55 |
| 2012/0319623 A1 * | 12/2012 | Cheng | G02F 1/13452 174/250 |
| 2015/0237726 A1 | 8/2015 | Shin et al. | |
| 2016/0306214 A1 * | 10/2016 | Ikeda | G02F 1/1345 |
| 2017/0102795 A1 * | 4/2017 | Wang | G02F 1/13338 |
| 2018/0101078 A1 * | 4/2018 | Xian | G02F 1/1345 |
| 2021/0225316 A1 * | 7/2021 | Huang | G09G 3/3677 |
| 2022/0187665 A1 * | 6/2022 | Xiao | H01L 27/124 |
| 2022/0344480 A1 | 10/2022 | Wang et al. | |
| 2022/0406816 A1 | 12/2022 | Xu et al. | |
| 2023/0371184 A1 * | 11/2023 | Liu | H05K 1/028 |
| 2023/0378411 A1 * | 11/2023 | Zhu | G09G 3/20 |
| 2024/0194101 A1 * | 6/2024 | Du | H01L 27/124 |
| 2024/0248352 A1 * | 7/2024 | Dai | H01L 21/60 |
| 2024/0249695 A1 * | 7/2024 | Hou | H05K 1/189 |

\* cited by examiner

CIRCUIT BOARD, DISPLAY SUBSTRATE AND DISPLAY APPARATUS

This application is a National Stage of International Application No. PCT/CN2022/078386, filed on Feb. 28, 2022, which is hereby incorporated by reference in its entirety.

FIELD

The disclosure relates to the field of display technology, and particularly to a circuit board, a display substrate and a display apparatus.

BACKGROUND

With the rapid development of display technology, display panels are increasingly developing towards the direction of high integration and low cost. Here, the GA Driver on Array (GOA) technology integrates a Thin Film Transistor (TFT) gate drive circuit on the array substrate of the display panel to form a scan drive for the display panel, thereby omitting the wiring space of the bonding area of the gate Integrated Circuit (IC) and the Fanout area. This can not only reduce the product cost in terms of material cost and manufacturing process, but also make the display panel realize the aesthetic design with two symmetrical sides and narrow border.

As the size, refresh rate and display resolution of the display product continue to increase, the panel load has increased significantly. In addition, due to the influence of the process, the working states of some tubes in the gate drive circuit (Integrated Circuit, IC) cannot reach the ideal level, so that the current of the clock line (Clock, CLK) rises sharply, and the temperature of the Patterned Line on Glass (PLG) between the Chip on Film (COF) and the gate drive circuit also increases simultaneously. When the PLG temperature exceeds a certain range, the problem of burning the Polarizer (POL) will occur, and even the heat is transferred to the display area (Active Area, AA), so that the temperature of the AA is too high, resulting in clearing and loss of liquid crystal characteristic.

As a result, how to reduce the PLG temperature has become an urgent technical problem to be solved.

SUMMARY

The disclosure provides a circuit board, a display substrate and a display apparatus, to reduce the PLG temperature.

In a first aspect, an embodiment of the disclosure provides a circuit board, including an input side and an output side oppositely arranged, where the output side is configured to electrically connected to a display substrate; the circuit board includes a plurality of signal lines extending in a direction from the input side to the output side, each of the signal lines includes a main body and a plurality of output branches, each of the output branches is connected to one end of the main body close to the output side and has a same line width, and a line width of the main body is greater than a sum of line widths of all the output branches.

In a possible implementation, the circuit board further includes an ink layer covering a central area of the main body of each of the signal lines, where there is a preset distance between an edge of the ink layer close to the output side and an edge of the main body close to the output side.

In a possible implementation, a ratio of a line length of the main body to a line length of a signal line to which the main body belongs is greater than ½.

In a possible implementation, a ratio of the line length of the main body to a line length of each of the output branches belonging to the same signal line is greater than 2.

In a possible implementation, a ratio of the line width of the main body to the sum of the line widths of all the output branches belonging to the same signal line is greater than 2.

In a possible implementation, a distance between two adjacent signal lines is a second distance, a distance between two adjacent output branches of the two adjacent signal lines is a first distance, and the first distance is substantially equal to the second distance.

In a possible implementation, an edge of an outermost output branch and an edge of the main body of the same signal line extend along a same straight line.

In a possible implementation, a distance between two adjacent output branches of the same signal line is a third distance, and the third distance is smaller than the first distance.

In a possible implementation, each of the signal lines further includes an input part connected to one end of the main body close to the input side, and a line length of each of the output branches of the same signal line is not greater than a line length of the input part.

In a possible implementation, a line width of each of the output branches of the same signal line is not greater than a line width of the input part.

In a possible implementation, the circuit board further includes a data driving chip, where the plurality of signal lines are provided on two opposite sides of the data driving chip, and an orthographic projection of the data driving chip on the circuit board does not overlap with orthographic projections of the plurality of signal lines on the circuit board.

In a possible implementation, the signal lines include at least one of a clock signal line, a high potential signal line, a low potential signal line or a frame start signal line.

In a second aspect, an embodiment of the disclosure further provides a display substrate, including a display area and a bonding area, where the bonding area includes a plurality of pads, each of the pads is arranged corresponding to each of the signal lines in the circuit board according to any one of the above implementations, each of the pads includes another main body and a plurality of input branches connected to one end of the another main body away from the display area, a line width of each of the input branches is equal to a line width of each of the output branches, and a line width of the another main body is greater than a sum of line widths of all the input branches.

In a possible implementation, a non-display area of the display substrate surrounding the display area further includes: a plurality of other signal lines arranged corresponding to the plurality of pads, and a gate drive circuit connected to the plurality of other signal lines, where the plurality of other signal lines are correspondingly connected to the plurality of signal lines.

In a possible implementation, the display substrate further includes a printed circuit board electrically connected to the circuit board and a timing control board electrically connected to the printed circuit board, where the timing control board includes a level conversion circuit, and a power management chip and a timing management chip electrically connected to the level conversion circuit respectively.

In a third aspect, an embodiment of the disclosure further provides a display apparatus, including: the display substrate according to any one of the above implementations, and the circuit board according to any one of the above implementations electrically connected to the display substrate through the plurality of pads.

DETAILED DESCRIPTION OF EMBODIMENTS

In order to make the purposes, technical solutions and advantages of the disclosure clearer, the technical solutions of embodiments of the disclosure will be described clearly and completely below in combination with the accompanying drawings of embodiments of the disclosure. Obviously the described embodiments are a part of embodiments of the disclosure but not all embodiments. Also in the case of no conflict, embodiments and the features therein in the disclosure may be combined with each other. Based upon embodiments of the disclosure, all of other embodiments obtained by those ordinary skilled in the art without creative work pertain to the protection scope of the disclosure.

Unless otherwise defined, the technical or scientific terms used in the disclosure shall have the general meaning understood by those ordinary skilled in the art to which the disclosure belongs. The word such as "include" or "contain" or the like used in the disclosure means that the element or object appearing before this word encompasses the elements or objects and their equivalents listed after this word, without excluding other elements or objects.

It is necessary to note that the size and shape of each diagram in the accompanying drawings do not reflect the true proportion, and are merely for purpose of schematically illustrating the content of the disclosure. Also, the same or similar reference numbers represent the same or similar elements or the elements having the same or similar functions all the way.

In the related technology, the liquid crystal display screen often uses the GOA bilateral drive, and the input working signals such as clock signals and frame start signals pass through the COFs on both sides of the screen respectively and are input to the GOA module at the screen end. With the development of large-size display products, the continuous improvement of parameters such as refresh rate and display resolution makes the panel load heavier and heavier.

The working current of the GOA module has been greatly increased compared with ordinary display products, and the problem of too high PLG temperature is also becoming more and more prominent. Through practice, the inventor found that there is a risk that the POL is burned out when the PLG temperature exceeds about 50 degrees, so that the panel is unable to display normally.

The inventor found in actual research that the wiring of the clock signal is to firstly pass through the corner area of the COF, then pass through the GOA area at the screen end, and finally reach the GOA module. The corner area of the COF is generally an area with the maximum line resistance and is closer to the Fanout and COF, and the temperature of the corner area of the COF is easily affected by the temperatures of the Fanout and COF; the temperature of the GOA area depends on the unit line resistance thereof. After testing, the inventor found that the temperature of the COF area is generally higher than 50 degrees and has a relatively high risk, while the temperature of the GOA area is lower and has a slightly low risk.

Figure 1:
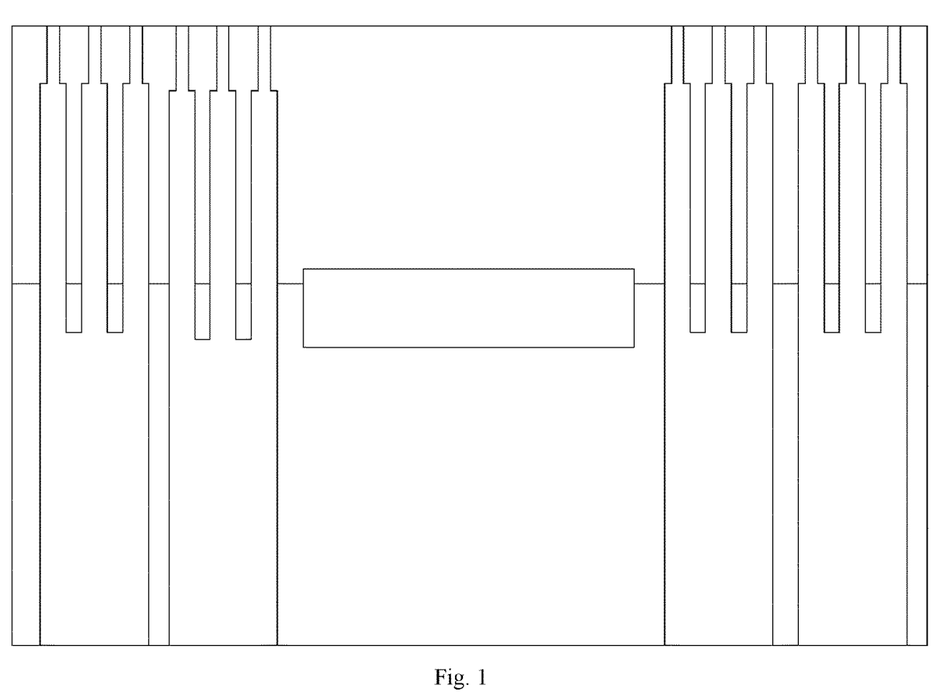
FIG. 1 is a schematic structural diagram of a COF in the related art.
Figure 2:
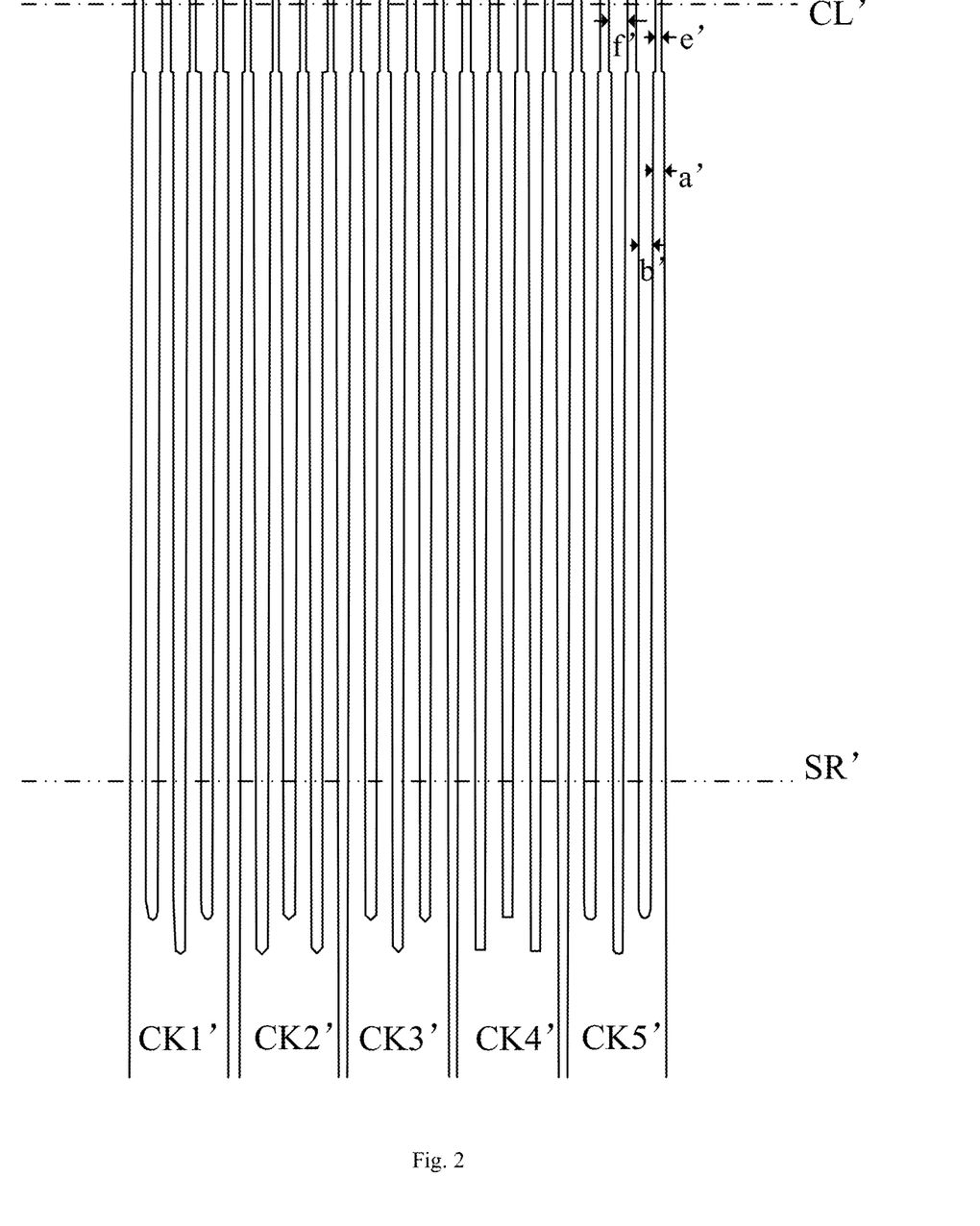
FIG. 2 is an enlarged structural diagram of wiring of some clock signals in FIG. 1.

In the related art, as shown in FIG. 1 and FIG. 2, FIG. 1 is a schematic structural diagram of a COF, and FIG. 2 is an enlarged structural diagram of wiring of some clock signals in FIG. 1. CK1', CK2', CK3', CK4' and CK5' represent clock signal lines respectively, the dotted line CL' in the figure represents the cross-section line, and the dotted line SR' represents the ink marking line. That is to say, at the output end of the COF in the related art, each clock signal line is divided into a plurality of leads with gradually changed widths, and those leads are recombined together at SR'. In this design mode, the resistance of the clock signal wiring is relatively large, which is not conducive to heat dissipation and is easily lead to excessive heat of the PLG.

In one of embodiments, the width a' of a single lead is 17 μm, the pitch b' is 18 μm, and each clock signal wiring may have 5 leads. Correspondingly, the effective width of the total leads of each clock signal wiring is 17 μm*5=85 μm, the distance e' may be 11 μm, and the distance f' may be 24 μm.

In view of this, embodiments of the disclosure provide a circuit board, a display substrate and a display apparatus, to reduce the PLG temperature.

Figure 3:
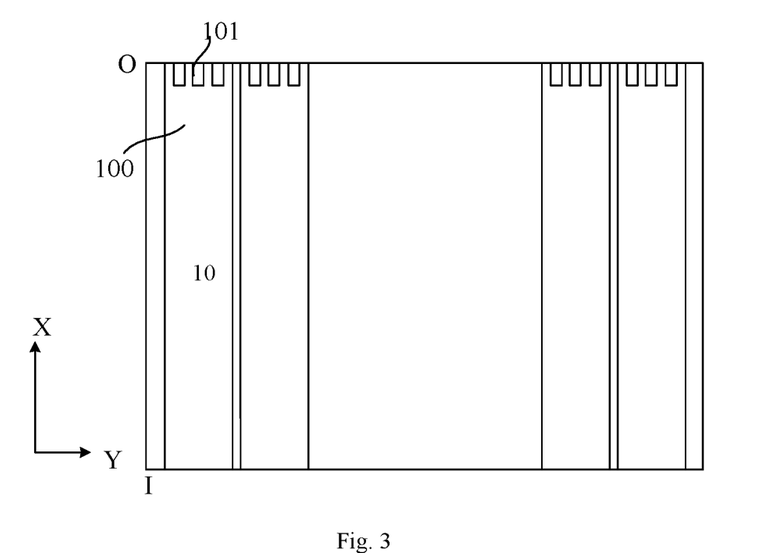
FIG. 3 is a schematic structural diagram of a circuit board according to an embodiment of the disclosure.

As shown in FIG. 3, an embodiment of the disclosure provides a circuit board, including an input side I and an output side O oppositely arranged, where the output side O is configured to electrically connected to a display substrate; the circuit board includes a plurality of signal lines 10 extending in a direction from the input side I to the output side O, each of the signal lines 10 includes a main body 100 and a plurality of output branches 101, each of the output branches 101 is connected to one end of the main body 100 close to the output side O and has a same line width, and a line width of the main body 100 is greater than a sum of line widths of all the output branches 101.

In a specific implementation process, the circuit board includes an input side I and an output side O oppositely arranged, where the output side O is configured to electrically connected to the display substrate, and the signals related to the display function from the input side I may pass through the output side O and be output to the display substrate, thereby ensuring the display function of the display substrate. In addition, the circuit board includes a plurality of signal lines 10 extending in the direction from the input side I to the output side O, and the direction from the input side I to the output side O may be the direction shown by the arrow X in FIG. 3. The specific number of signal lines 10 may be set by those skilled in the art according to actual application requirements, which is not limited here. Each signal line 10 includes a main body 100 and a plurality of output branches 101, and the specific number of output branches 101 may be set by those skilled in the art according to actual application requirements, which is not limited here. Each output branch 101 is connected to one end of the main body 100 close to the output side O, and the output branches 101 have the same line width and same line length. It should be noted that the "line width" involved in the disclosure refers to the length of the corresponding part of the signal line 10 extending in the direction intersecting the direction from the input side I to the output side O, and the direction intersecting the direction from the input side I to the output side O may be the direction shown by the arrow Y in FIG. 3. The "line length" involved in the disclosure is the length of the corresponding part of the signal line 10 extending in the direction from the input side I to the output side O. The line width of the main body 100 is greater than the sum of the line widths of all the output branches 101. In this way, when the main body 100 is made longer, not only the heat dissipation area is increased, but also the resistance of the signal line 10 is effectively reduced. Thus, after the output side O of the circuit board is electrically connected to the display substrate, the operating temperature of the signal line 10 may be effectively reduced. When the circuit board is used for the COF, the temperature of the PLG in the corner area of the COF is reduced, not only avoiding the impact on the reliability of high temperature and high humidity of the GOA area, but also avoiding the burning of the POL, further avoiding the heat transfer to the AA area, and thereby ensuring the use performance of the display substrate.

Figure 4:
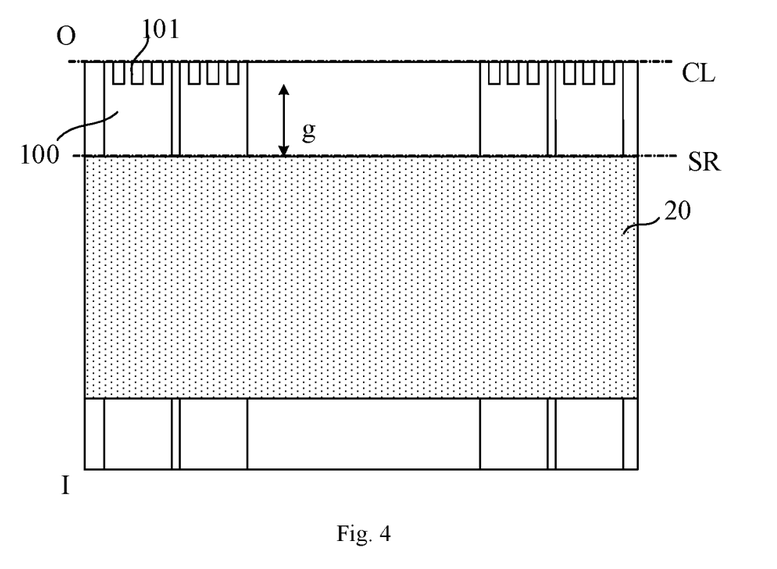
FIG. 4 is a schematic structural diagram of a circuit board according to an embodiment of the disclosure.

In an embodiment of the disclosure, as shown in FIG. 4, the circuit board further includes an ink layer 20 covering a central area of the main body 100 of each of the signal lines 10. There is a preset distance between an edge of the ink layer 20 close to the output side O and an edge of the main body 100 close to the output side O.

In a specific implementation process, the circuit board further includes an ink layer 20 that may cover the central area of the main body 100 of each signal line 10, protecting each signal line 10 through the ink layer 20, avoiding the short connection between signal lines 10, and thus ensuring the use performance of the circuit board. Moreover, the ink layer 20 may be green ink, and of course, the specific material of the ink layer 20 can also be set according to actual application needs, which is not limited here. Here, the dotted line SR in FIG. 4 represents the marking line of the ink layer 20, and the dotted line CL in FIG. 4 represents a cross-section line. In the actual process of fabricating the circuit board, it is necessary to remove the part of each signal line 10 on a side of CL away from SR. Moreover, there is a preset distance between the edge of the ink layer 20 close to the output side O and the edge of the main body 100 close to the output side O, and the preset distance may be set according to the actual bonding requirement of the circuit board, which is not limited here. Still referring to FIG. 4, g is the preset distance.

In an embodiment of the disclosure, a ratio of a line length of the main body 100 to a line length of a signal line 10 to which the main body 100 belongs is greater than ½.

Figure 5:
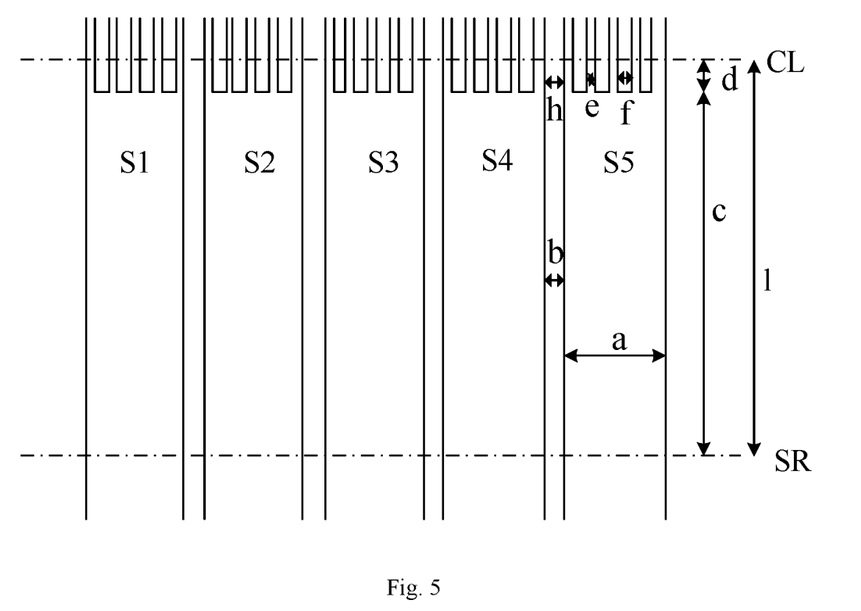
FIG. 5 is a schematic diagram of a wiring structure of some signal lines in FIG. 4.

As shown in FIG. 5, which is a schematic diagram of a wiring structure of some signal lines 10 in FIG. 4, the ratio of the line length of the main body 100 to the line length of the signal line 10 to which the main body 100 belongs is greater than ½. Here, FIG. 5 shows five signal lines including S1, S2, S3, S4 and S5, where c is greater than ½*1, c represents the line length of the main body 100, d represents the line length of the corresponding output branch of the main body 100, and 1 represents the line length of the signal line 10 to which the main body 100 belongs. That is, the line length of the main body 100 is longer than half of the line length of the signal line 10 to which the main body 100 belongs. In this way, when the line length of the main body 100 of each signal line 10 is made longer and the line width is made wider, the resistance of each signal line 10 may be effectively reduced, thereby reducing the temperature of the PLG. In one of embodiments, c may be 800 μm-1500 μm, including endpoint values, for example, may be 800 μm, 1000 μm or 1100 μm, etc.; d may be 50 μm-200 μm, including endpoint values, for example, may be 50 μm, 100 μm, 150 μm or 200 μm, which is not limited here; and correspondingly, 1 may be 1000 μm-1400 μm, including endpoint values, and may be 1000 μm, 1100 μm, 1200 μm, etc., which is not limited here. Of course, the specific values of c and d can also be set according to actual application requirements, which are not limited here.

It should be noted that, in an embodiment of the disclosure, the distance between the edge of the ink layer 20 close to the output side O and the edge of the main body 100 close to the output side O is taken as the line length of the main body 100, and the distance from CL to SR is taken as the line length of the signal line 10 to which the main body 100 belongs, to further explain the signal line 10 in the disclosure. In an actual implementation process, the body part 100 also substantially includes a part covered by the ink layer 20, and accordingly, the line length of the main body 100 substantially includes the line length of the part covered by the ink layer 20. But, considering that the part covered by the ink layer 20 is set without difference from that in the related art, only the part of the signal line 10 that is close to the output side O and not covered by the ink layer 20 is used as a representative for illustration, in order to highlight the concept of the disclosure.

In an embodiment of the disclosure, a ratio of the line length of the main body 100 to a line length of each of the output branches 101 belonging to the same signal line 10 is greater than 2.

Still referring to FIG. 5, the ratio of the line length of the main body 100 to the line length of each output branch 101 belonging to the same signal line 10 is greater than 2, namely c>2d; that is to say, the line length of the main body 100 is longer than twice the line length of each output branch 101 belonging to the same signal line 10. In this way, when the line length of the main body 100 of each signal line 10 is made longer and the line width is made wider, the resistance of each signal line 10 may be effectively reduced, thereby reducing the temperature of the PLG. Still taking the above embodiment as an example, c may be 1100 μm, and d may be 100 μm.

In an embodiment of the disclosure, a ratio of the line width of the main body 100 to the sum of the line widths of all the output branches 101 belonging to the same signal line 10 is greater than 2.

Still referring to FIG. 5, the ratio of the line width of the main body 100 to the sum of the line widths of all the output branches 101 belonging to the same signal line 10 is greater than 2, where a represents the line width of the main body 100, and e represents the line width of the output branch 101; that is to say, the line width of the main body 100 is wider than twice the sum of the line widths of all the output branches 101 belonging to the same signal line 10. In this way, when the line length of the main body 100 of each signal line 10 is made longer and the line width is made wider, the resistance of each signal line 10 may be effectively reduced, thereby reducing the temperature of the PLG. In one of embodiments, the number of output branches 101 corresponding to the main part 100 belonging to the same signal line 10 may be 5; a may be 50 μm-200 μm, including endpoint values, for example, may be 50 m, 100 μm or 139 μm etc.; and e may be 5 μm-20 μm, including endpoint values, for example, may be 5 μm, 10 μm or 12 μm, etc. Of course, a and e may also be set according to actual application requirements, which are not limited here.

In an embodiment of the disclosure, a distance between two adjacent signal lines 10 is a second distance, a distance between two adjacent output branches 101 of the two adjacent signal lines 10 is a first distance, and the first distance is substantially equal to the second distance.

Still referring to FIG. 5, the distance between two adjacent signal lines 10 is the second distance, and the distance between two adjacent output branches 101 of two adjacent signal lines 10 is the first distance, where b represents the distance between adjacent signal lines 10, h represents the distance between two adjacent output branches 101 of two adjacent signal lines 10, and b=h. The "equal" here may be completely equal or approximately equal, which is not limited here. The first distance is roughly equal to the second distance. In this case, on the premise of making each signal line 10 wider, the manufacturing cost of each signal line 10 is simplified. In one of embodiments, both h and b may be 10 μm-50 μm, including endpoint values, for example, may be 10 μm, 20 μm or 30 μm, etc. Of course, h and b can also be set according to actual application requirements, which is not limited here.

In an embodiment of the disclosure, an edge of an outermost output branch 101 and an edge of the main body 100 of the same signal line 10 extend along a same straight line.

Still referring to FIG. 5, the edge of the outermost output branch 101 and the edge of the main body 100 of the same signal line 10 extends along the same straight line, so that it may be ensured that the width of each output branch 101 on the same signal line 10 is maximized, simplifying the manufacturing cost of the signal line 10 while effectively reducing the resistance of the signal line 10.

In an embodiment of the disclosure, a distance between two adjacent output branches of the same signal line is a third distance, and the third distance is smaller than the first distance.

Still referring to FIG. 5, the distance between two adjacent output branches 101 of the same signal line 10 is the third distance, namely f<b, where f represents the distance between two adjacent output branches 101. In this way, during the processing of the circuit board, not only the damage of the signal line 10 may be avoided, but also the generation of debris may be avoided, thereby ensuring the use performance of the circuit board. In one of embodiments, f may be 5 μm-40 μm, such as 5 μm, 20 μm or 24 μm, etc. Of course, the specific value of f can also be set according to actual application requirements, which is not limited here.

Figures 6, 7:
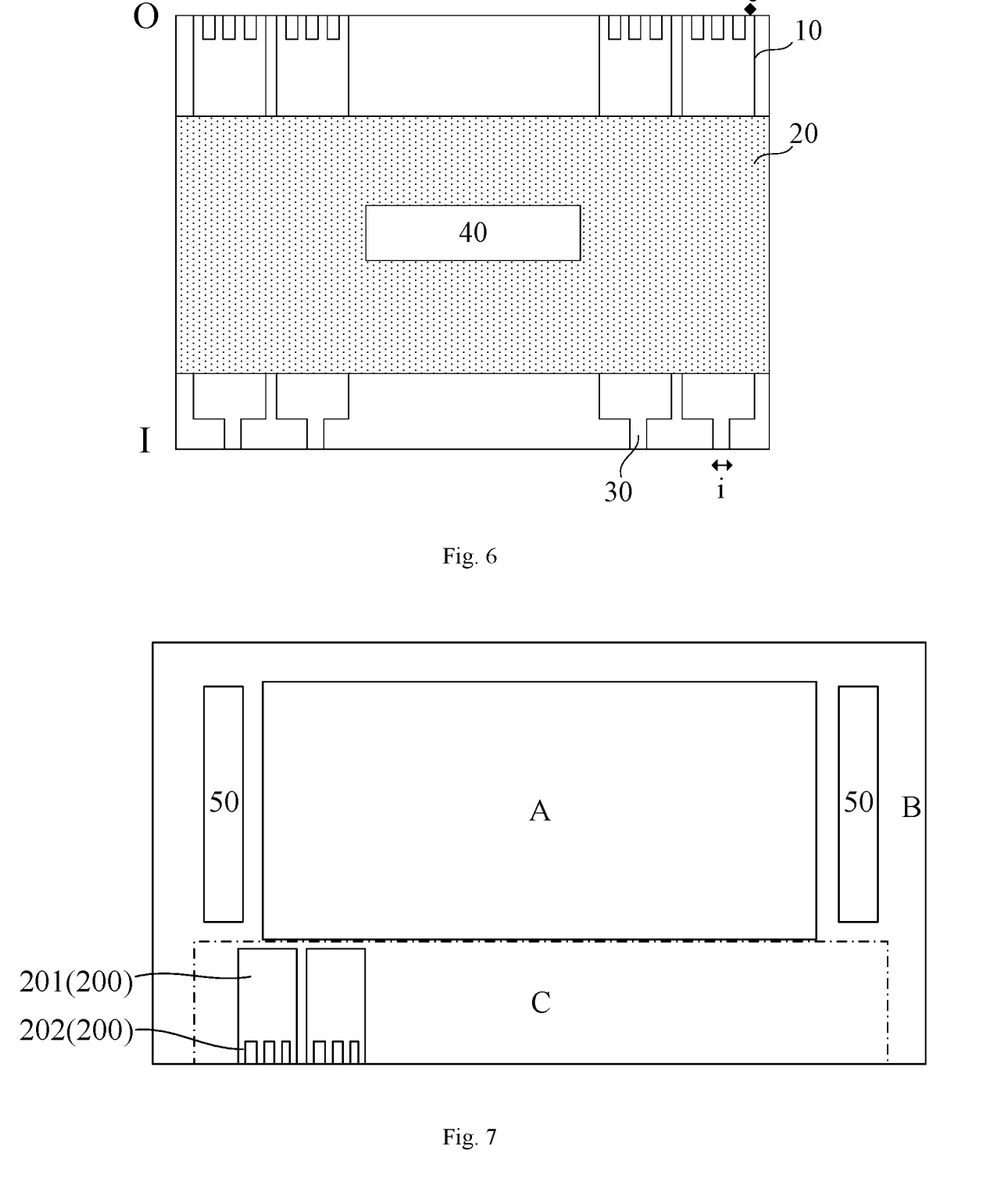
FIG. 6 is a schematic structural diagram of a circuit board according to an embodiment of the disclosure.
FIG. 7 is a schematic structural diagram of a display substrate according to an embodiment of the disclosure.

In an embodiment of the disclosure, as shown in FIG. 6, each of the signal lines 10 further includes an input part 30 connected to one end of the main body 100 close to the input side I, and a line length of each of the output branches 101 of the same signal line 10 is not greater than a line length of the input part 30.

Still referring to FIG. 6, each signal line 10 further includes an input part 30 connected to one end of the main body 100 close to the input side I, the input part 30 is configured to electrically connected to a printed circuit board, and the line length of each output branch 101 of the same signal line 10 is less than or equal to the line length of the input part 30, ensuring the effective connection between the printed circuit board and the input part 30, and thereby improving the use performance of the circuit board.

In an embodiment of the disclosure, as shown in FIG. 6, the line width of each output branch 101 of the same signal line 10 is not greater than the line width of the input part 30, namely e≤i, where e represents the line width of each output branch 101, and i represents the line width of the input part 30. In this way, the stability of the connection between the printed circuit board and the input part 30 is ensured. In one of embodiments, e may be 5 μm-20 μm, including endpoint values, for example, may be 5 μm, 10 μm or 12 μm, etc.; and i may be 100 μm-300 μm, including endpoint values, for example, may be 100 μm, 150 μm, 170 μm or 200 μm, etc. Of course, the line length and line width of the input part 30 can also be set according to actual application requirements, which are not limited here.

In an embodiment of the disclosure, for the same signal line 10, a plurality of leads with the same electrical property may be connected together. The overall design may be a copper laying design, and a plurality of output branches 101 are still retained at the CL position, thereby ensuring the module bonding requirement. For each signal line 10, the line width and line length of the corresponding part and the distance between adjacent parts may be set according to actual application requirements, which are not limited here.

In an embodiment of the disclosure, still referring to FIG. 6, the circuit board further includes a data driving chip 40. The plurality of signal lines 10 are provided on two opposite sides of the data driving chip 40, and an orthographic projection of the data driving chip 40 on the circuit board does not overlap with orthographic projections of the plurality of signal lines 10 on the circuit board.

Still referring to FIG. 6, the circuit board further includes a data driving chip 40, where the plurality of signal lines 10 are provided on two opposite sides of the data driving chip 40. The plurality of signal lines 10 provided on two opposite sides may be symmetrically arranged relative to the data driving chip 40, thereby ensuring the function of the circuit board to drive the display substrate bilaterally; and moreover, the orthographic projection of the data driving chip 40 on the circuit board does not overlap with the orthographic projections of the plurality of signal lines 10 on the circuit board.

In an embodiment of the disclosure, the signal lines 10 include at least one of a clock signal line, a high potential signal line, a low potential signal line or a frame start signal line.

In a specific implementation process, the signal line 10 may be a clock signal line, or a high potential signal line, or a low potential signal line, or a frame start signal line, or a combination of at least two of a clock signal line, a high potential signal line, a low potential signal line and a frame start signal line, which is not limited here. Certainly, various signal lines 10 between the circuit board and the display substrate can also be set as described above according to actual application requirements, which are not limited here.

Based on the same disclosure concept, as shown in FIG. 7, an embodiment of the disclosure further provides a display substrate, including a display area A and a bonding area C. The bonding area C includes a plurality of pads 200, each of the pads 200 is arranged corresponding to each of the signal lines 10 in the circuit board described above, each of the pads 200 includes another main body 201 and a plurality of input branches 202 connected to one end of the another main body 201 away from the display area A, a line width of each of the input branches 202 is equal to a line width of each of the output branches 101, and a line width of the another main body 201 is greater than a sum of line widths of all the input branches 202.

Still referring to FIG. 7, the display substrate includes a display area A and a bonding area C, where the bonding area C includes a plurality of pads 200, each pad 200 is arranged corresponding to each signal line 10 in the circuit board described above, and each pad 200 includes another main body 201 and a plurality of input branches 202. For example, the main body 100 of each signal line 10 of the circuit board is connected with four output branches 101, and each pad 200 includes another main body 201 arranged corresponding to the main body 100 of each signal line 10, and four input branches 202 arranged corresponding to the four output branches 101 of each signal line 10. The line width of each input branch of the pad 200 is equal to the line width of each output branch 101, and the line width of another main body 201 of each pad 200 is equal to the line width of each main body 100 of each circuit board. The "equal" here may be completely equal or approximately equal, which is not limited here. In this way, when the circuit board is electrically connected to the display substrate through the plurality of pads 200 later, the structural stability of the connection and the reliability of signal transmission are ensured. In addition, the line width of another main part 201 of each pad 200 is greater than the sum of the line widths of all the input branches 202, reducing the resistance of each pad 200, and thereby reducing the PLG temperature during the operation of the display substrate, and ensuring the use performance of the display substrate. Moreover, the number of pads 200 may be set according to actual application requirements, which is not limited here.

In an embodiment of the disclosure, still as shown in FIG. 7, a non-display area B of the display substrate surrounding the display area A further includes: a plurality of other signal lines arranged corresponding to the plurality of pads 200, and a gate drive circuit 50 connected to the plurality of other signal lines, where the plurality of other signal lines are correspondingly connected to the plurality of signal lines.

In a specific implementation process, the non-display area B of the display substrate surrounding the display area A further includes a plurality of other signal lines arranged corresponding to the plurality of pads 200, where the number of pads 200 is the same as the number of other signal lines. The non-display area B further includes a gate drive circuit 50 connected to the plurality of other signal lines. The gate drive circuit 50 may include a plurality of shift registers, and the specific number of shift registers may be set according to actual application requirements, which is not limited here. In this way, the required signal may be provided to the gate drive circuit 50 through the circuit board, thereby ensuring the use performance of the display substrate. In addition, the specific layout of the display area A, the non-display area B and the bonding area C may be set according to actual application requirements, which is not limited here.

Figure 8:
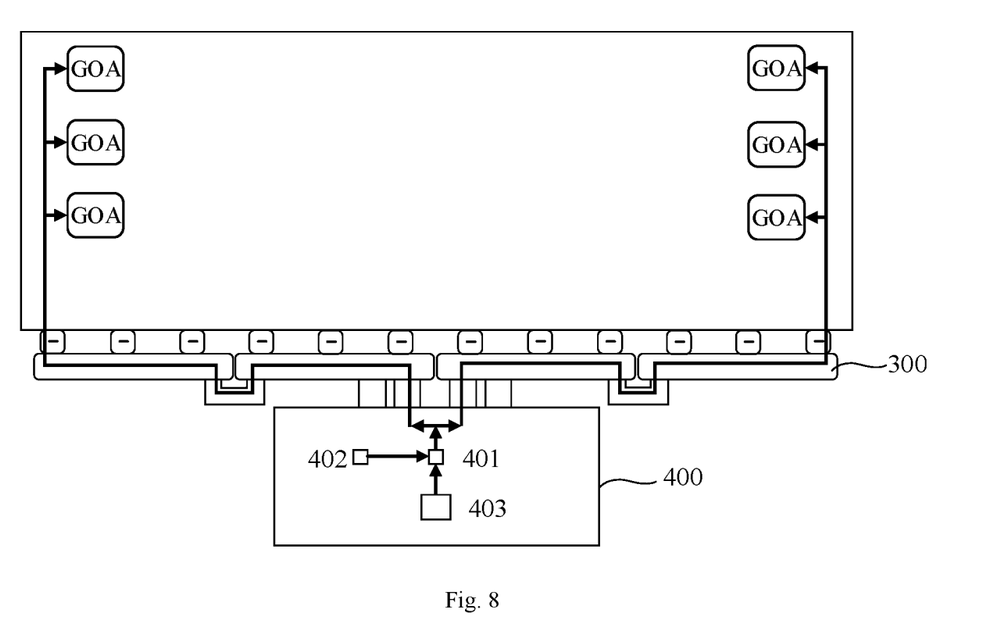
FIG. 8 is a schematic structural diagram of a display substrate according to an embodiment of the disclosure.

In an embodiment of the disclosure, as shown in FIG. 8, the display substrate further includes a printed circuit board 300 electrically connected to the circuit board and a timing control board 400 electrically connected to the printed circuit board 300. The timing control board 400 includes a level conversion circuit 401, and a power management chip 402 and a timing management chip 403 electrically connected to the level conversion circuit 401 respectively.

In a specific implementation process, the display substrate further includes a printed circuit board 300 electrically connected to the circuit board and a timing control board 400 electrically connected to the printed circuit board 300. The timing control board 400 includes a level conversion circuit 401, and a power management chip 402 and a timing management chip 403 electrically connected to the level conversion circuit 401 respectively. Here, the timing management chip 403 may output an original control signal such as a clock signal, a high potential signal, a low potential signal or a frame start signal, and output the original control signal to the level conversion circuit 401. The level conversion circuit 401 may perform level conversion on the original control signal, for example, convert a low voltage to a high voltage, and generate a signal required for the gate drive circuit to work according to a certain logic, and then input the signal to the display substrate for driving, thereby ensuring the use performance of the display substrate. The power management chip 402 is configured to provide the working power required by the timing management chip 403 and the level conversion circuit 401, thereby ensuring the normal operation of the timing management chip 403 and the level conversion circuit 401. For example, the timing management chip 403 may output a signal voltage of 3.3V, which can reach 40V after being converted by the level conversion circuit 401. In this way, the signal wiring path of the display substrate may be as shown in FIG. 8, where the gate drive circuit 50 can include a plurality of GOA units, and the direction indicated by the arrow in the figure is the flow direction of the signal. If the circuit board is a flexible circuit board and may be a COF, signals (including a clock signal, a frame start signal, a high potential signal, etc.) generated by the timing management chip 403 and a voltage signal such as a low potential signal or LVGL generated by the power management chip 402 can reach the GOA area of the display substrate through the FFC, XPCB, FPC and the COF on the outermost side after the level conversion performed by the level conversion circuit 401. The use of the circuit board in an embodiment of the disclosure avoids the relatively high temperature at the corner of the COF, thereby ensuring the use performance of the display substrate.

In addition, the principle of the display substrate to solve the problem is similar to that of the above-mentioned circuit board, so implementations of the display substrate can refer to implementations of the above-mentioned circuit board, and the detailed description thereof will be omitted.

Figure 9:
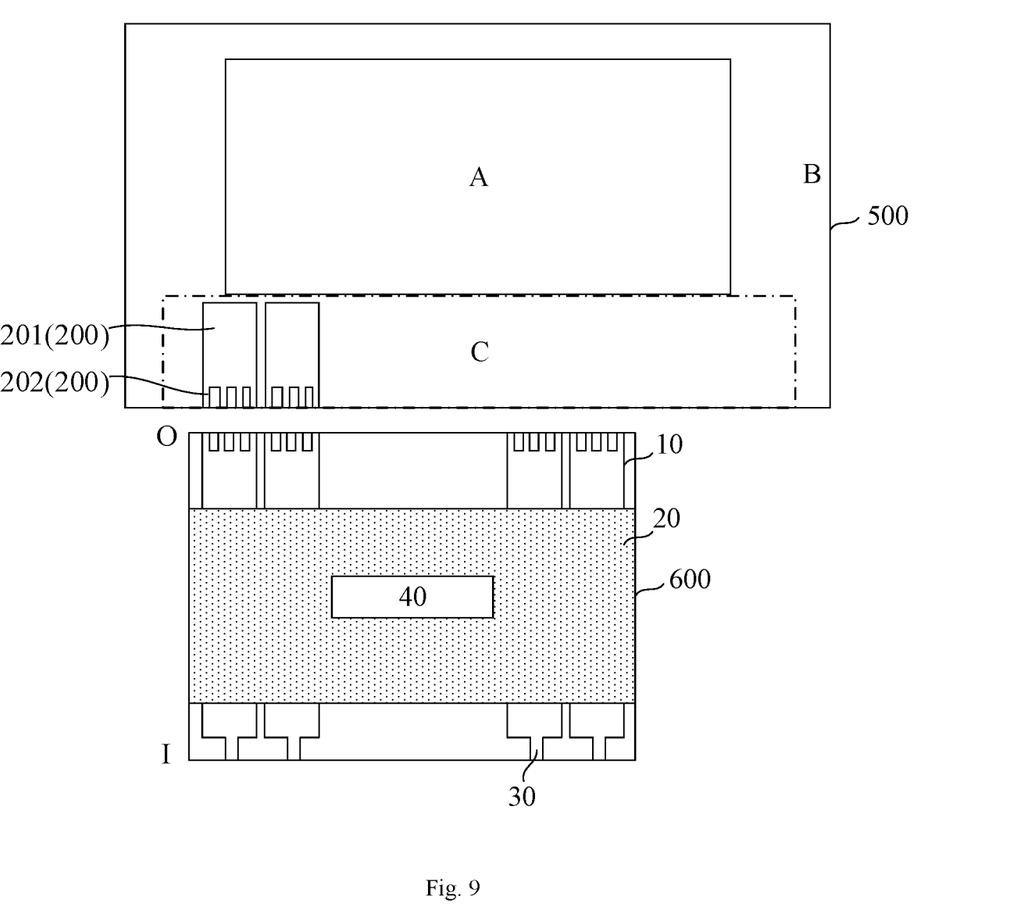
FIG. 9 is a schematic structural diagram of a display apparatus according to an embodiment of the disclosure.

Based on the same disclosure concept, as shown in FIG. 9, an embodiment of the disclosure provides a display apparatus, including the display substrate 500 described above, and the circuit board 600 described above electrically connected to the display substrate 500 through the plurality of pads.

In the specific implementation process, the principle of the display apparatus to solve the problem is similar to that of the above-mentioned circuit board and display substrate, so the implementations of the display apparatus can refer to the implementations of the above-mentioned circuit board and display substrate, and the repeated description thereof will be omitted.

The display apparatus provided by embodiments of the disclosure may be a mobile phone, a tablet, a television, a display, a laptop, a digital photo frame, a navigator, or any other product or component with display function. All of other indispensable components of the display apparatus should be understood by those ordinary skilled in the art to be included, and will be omitted here and should not be considered as limitations on the disclosure. In addition, the relevant display parameters of the display apparatus may be 4K, 8K, 60 Hz, 120 Hz, 144 Hz, etc., which are not limited here.

Embodiments of the disclosure provide a circuit board, a display substrate and a display apparatus, where the circuit board includes an input side I and an output side O oppositely arranged, the output side O is configured to electrically connected to the display substrate, the circuit board includes a plurality of signal lines 10 extending in a direction from the input side I to the output side O, each signal line 10 includes a main body 100 and a plurality of output branches 101, each output branch 101 is connected to one end of the main body 100 close to the output side O and has a same line width, and a line width of the main body 100 is greater than a sum of line widths of all the output branches 101. In this way, when the main body 100 is made longer, not only the heat dissipation area is increased, but also the resistance of the signal line 10 is effectively reduced. Thus, after the output side O of the circuit board is electrically connected to the display substrate, the operating temperature of the signal line 10 may be effectively reduced. When the circuit board is used for the COF, the temperature of the PLG in the corner area of the COF is reduced, not only avoiding the impact on the reliability of high temperature and high humidity of the GOA area, but also avoiding the burning of the POL, further avoiding the heat transfer to the AA area, and thereby ensuring the use performance of the display substrate.

In embodiments of the disclosure, the process requirement is low, the cost is not increased, the implementation is easy, and the characteristics of the TFT are not affected. The inventor found that this GOA signal wiring method can not only effectively reduce the resistance of the signal line and reduce the temperature rise, but also play a role in heat dissipation to a certain extent, thereby reducing the temperature of the PLG. This method may be applied to 4K, 8K, 60 Hz, 120 Hz, 144 Hz and other products.

Although embodiments of the disclosure have been described, those skilled in the art can make additional alterations and modifications to these embodiments once they learn about the basic creative concepts. Thus, the attached claims are intended to be interpreted to include embodiments as well as all the alterations and modifications falling within the scope of the disclosure.

Evidently those skilled in the art can make various modifications and variations to the present application without departing from the spirit and scope of the present application. Thus the present application is also intended to encompass these modifications and variations therein as long as these modifications and variations to the present application come into the scope of the claims of the present application and their equivalents.

What is claimed is:

1. A display substrate, comprising a display area and a bonding area, wherein the bonding area comprises a plurality of pads, each of the plurality of pads is arranged corresponding to each of a plurality of signal lines in a circuit board,
the circuit board comprises an input side and an output side oppositely arranged, wherein the output side is configured to electrically connect to the display substrate;
the circuit board comprises the plurality of signal lines extending in a direction from the input side to the output side, the each of the plurality of signal lines comprises a main body and a plurality of output branches, each of the plurality of output branches is connected to one end of the main body close to the output side and has a same line width, and a line width of the main body is greater than a sum of line widths of all the output branches belonging to same signal line;
each of the plurality of pads comprises another main body and a plurality of input branches connected to one end of the another main body away from the display area, a line width of each of the plurality of input branches is equal to a line width of the each of the plurality of output branches, and a line width of the another main body is greater than a sum of line widths of all the input branches belonging to same signal line;
a non-display area of the display substrate surrounding the display area further comprises: a plurality of other signal lines arranged corresponding to the plurality of pads, and a gate drive circuit connected to the plurality of other signal lines, wherein the plurality of other signal lines are correspondingly connected to the plurality of signal lines.

2. The display substrate according to claim 1, further comprising a printed circuit board electrically connected to the circuit board and a timing control board electrically connected to the printed circuit board, wherein the timing control board comprises a level conversion circuit, and a power management chip and a timing management chip electrically connected to the level conversion circuit respectively.

3. A display apparatus, comprising:
a display substrate and a circuit board electrically connected to the display substrate through a plurality of pads;
wherein the circuit board comprises an input side and an output side oppositely arranged, wherein the output side is configured to electrically connected to the display substrate; the circuit board comprises a plurality of signal lines extending in a direction from the input side to the output side, each of the plurality of signal lines comprises a main body and a plurality of output branches, each of the plurality of output branches is connected to one end of the main body close to the output side and has a same line width, and a line width of the main body is greater than a sum of line widths of all the output branches belonging to same signal line;
wherein the display substrate comprises a display area and a bonding area, wherein the bonding area comprises the plurality of pads, each of the plurality of pads is arranged corresponding to the each of the plurality of signal lines in the circuit board, each of the plurality of pads comprises another main body and a plurality of input branches connected to one end of the another main body away from the display area, a line width of each of the plurality of input branches is equal to a line width of the each of the plurality of output branches, and a line width of the another main body is greater than a sum of line widths of all the input branches belonging to same signal line;
a non-display area of the display substrate surrounding the display area further comprises: a plurality of other signal lines arranged corresponding to the plurality of pads, and a gate drive circuit connected to the plurality of other signal lines, wherein the plurality of other signal lines are correspondingly connected to the plurality of signal lines.

4. The display apparatus according to claim 3, the circuit board further comprising an ink layer covering a central area of the main body of the each of the plurality of signal lines, wherein there is a preset distance between an edge of the ink layer close to the output side and an edge of the main body close to the output side.

5. The display apparatus according to claim 3, wherein a ratio of a line length of the main body to a line length of a signal line to which the main body belongs is greater than ½.

6. The display apparatus according to claim 4, wherein a ratio of the line length of the main body to a line length of the each of the plurality of output branches belonging to the same signal line is greater than 2.

7. The display apparatus according to claim 3, wherein a ratio of the line width of the main body to the sum of the line widths of all the output branches belonging to the same signal line is greater than 2.

8. The display apparatus according to claim 3, wherein a distance between two adjacent signal lines is a second distance, a distance between two adjacent output branches of the two adjacent signal lines is a first distance, and the first distance is equal to the second distance.

9. The display apparatus according to claim 8, wherein an edge of an outermost output branch and an edge of the main body of the same signal line extend along a same straight line.

10. The display apparatus according to claim 9, wherein a distance between two adjacent output branches of the same signal line is a third distance, and the third distance is smaller than the first distance.

11. The display apparatus according to claim 2, wherein the each of the plurality of signal lines further comprises an input part connected to one end of the main body close to the input side, and a line length of the each of the plurality of output branches of the same signal line is not greater than a line length of the input part.

12. The display apparatus according to claim 11, wherein a line width of the each of the plurality of output branches of the same signal line is not greater than a line width of the input part.

13. The display apparatus according to claim 3, the circuit board further comprising a data driving chip, wherein the plurality of signal lines are provided on two opposite sides of the data driving chip, and an orthographic projection of the data driving chip on the circuit board does not overlap with orthographic projections of the plurality of signal lines on the circuit board.

14. The display apparatus according to claim 13, wherein the plurality of signal lines comprise at least one of a clock signal line, a high potential signal line, a low potential signal line or a frame start signal line.

* * * * *